(12) United States Patent
Katsamberis et al.

(10) Patent No.: US 6,652,988 B2
(45) Date of Patent: *Nov. 25, 2003

(54) COATED ARTICLE WITH EPOXY URETHANE BASED POLYMERIC BASECOAT

(75) Inventors: Dimitris Katsamberis, Novi, MI (US); John G. Finch, Livonia, MI (US); Joseph A. Elmer, Lake Orion, MI (US); Patrick A. Sullivan, Boulder, CO (US)

(73) Assignee: Masco Corporation, Taylor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/745,716

(22) Filed: Dec. 21, 2000

(65) Prior Publication Data

US 2002/0081438 A1 Jun. 27, 2002

(51) Int. Cl.$^7$ ................................. B32B 15/08
(52) U.S. Cl. ................ 428/626; 428/627; 428/660; 428/632; 428/633; 428/425.8
(58) Field of Search ............... 428/626, 660, 428/627, 632, 633, 425.8

(56) References Cited

U.S. PATENT DOCUMENTS

| | | | |
|---|---|---|---|
| 4,699,814 A | * | 10/1987 | Ambrose et al. ......... 427/407.1 |
| 5,413,874 A | | 5/1995 | Moysan, III et al. |
| 5,478,660 A | | 12/1995 | Moysan, III et al. |
| 5,482,788 A | | 1/1996 | Moysan, III et al. |
| 5,484,663 A | | 1/1996 | Moysan, III et al. |
| 5,552,233 A | | 9/1996 | Moysan, III et al. |
| 5,626,972 A | | 5/1997 | Moysan, III et al. |
| 5,639,564 A | | 6/1997 | Moysan, III et al. |
| 5,641,579 A | | 6/1997 | Moysan, III et al. |
| 5,648,179 A | | 7/1997 | Moysan, III et al. |
| 5,654,108 A | | 8/1997 | Moysan, III et al. |
| 5,667,904 A | | 9/1997 | Moysan, III et al. |
| 5,814,415 A | | 9/1998 | Moysan, III et al. |
| 5,824,424 A | * | 10/1998 | Haneishi et al. ............ 428/626 |
| 5,948,548 A | | 9/1999 | Welty et al. |
| 5,985,468 A | | 11/1999 | Sugg et al. |
| 5,989,730 A | | 11/1999 | Sugg et al. |
| 6,004,684 A | | 12/1999 | Sugg et al. |
| 6,033,790 A | | 3/2000 | Welty et al. |
| 6,090,490 A | | 7/2000 | Mokerji |
| 6,096,426 A | | 8/2000 | Mokerji |
| 6,103,381 A | | 8/2000 | Mokerji |
| 6,132,889 A | | 10/2000 | Welty et al. |
| 6,143,424 A | | 11/2000 | Jonte et al. |
| 6,154,311 A | | 11/2000 | Simmons, Jr. et al. |
| 6,168,242 B1 | | 1/2001 | Mokerji |
| 6,242,100 B1 | | 6/2001 | Mokerji |
| 6,268,060 B1 | | 7/2001 | Mokerji |
| 6,399,219 B1 | * | 6/2002 | Welty et al. .................. 428/626 |

FOREIGN PATENT DOCUMENTS

JP 62109868 A * 5/1987 ............ C09D/5/08

* cited by examiner

Primary Examiner—James J. Seidleck
Assistant Examiner—Melanie Bissett
(74) Attorney, Agent, or Firm—Lloyd D. Doigan

(57) ABSTRACT

An article is coated with a multi-layer decorative and protective coating. The coating contains a polymeric basecoat layer containing (i) an epoxy urethane resin or (ii) the reaction products of a polyamine and an epoxy urethane resin. Over the polymeric basecoat layer is a vapor deposited chromium, chromium compound, refractory metal compound or refractory metal alloy compound decorative and protective layer.

8 Claims, 2 Drawing Sheets

COATED ARTICLE WITH EPOXY URETHANE BASED POLYMERIC BASECOAT

FIELD OF THE INVENTION

This invention relates to articles, particularly brass articles, having a multi-layered decorative and protective coating thereon.

BACKGROUND OF THE INVENTION

It is sometimes the practice with various brass articles such as faucets, faucet escutcheons, door knobs, door handles, door escutcheons and the like to first buff and polish the surface of the article to a high gloss and to then apply a protective organic coating, such as one comprised of acrylics, urethanes, epoxies and the like, onto this polished surface. This system has the drawback that the buffing and polishing operation, particularly if the article is of a complex shape, is labor intensive. Also, the known organic coatings are not always as durable as desired, and are susceptible to attack by chemicals such as bases and acids. It would, therefore, be quite advantageous if brass articles, or indeed other articles, either plastic, ceramic, or metallic, could be provided with a coating which provided the article with a decorative appearance as well as providing wear resistance, abrasion resistance and corrosion resistance. It is known in the art that a multi-layered coating can be applied to an article which provides a decorative appearance as well as providing wear resistance, abrasion resistance and corrosion resistance. This multi-layer coating includes a decorative and protective vapor deposited color layer of a refractory metal compound such as a refractory metal nitride, e.g., zirconium nitride or titanium nitride. Such a coating system is described, inter alia, in U.S. Pat. Nos. 5,552,233; 5,922,478; 5,654,108 and 6,033,790. However, these patents describe, and it is currently the practice, to provide an electroplated basecoat layer, such as nickel, over the substrate and beneath the vapor deposited layer(s). The application of the electroplated basecoat layer requires electroplating equipment which is cumbersome and expensive. It also requires a laborious and time consuming electroplating step on the article to be coated. It would thus be very advantageous if the electroplated basecoat could be eliminated or replaced by another basecoat such as a polymer basecoat. However, selecting a polymer that will function as an effective basecoat is more of an empirical art than an exact and predictable science. There is generally difficulty in predicting how a given polymer will behave as a basecoat. A polymer to be an effective basecoat must have good adhesion to both the substrate and the overlying vapor deposited layers. Otherwise the coating will delaminate. While some polymers may adhere well to the substrate, they may not provide sufficient adhesion to the vapor deposited layers, and vice versa. Furthermore, a polymer must be sufficiently hard or have sufficient shape memory so that it will not undergo permanent severe elastic deformation when the overlying hard vapor deposited layers are impacted by an object. Also, the polymer must be uniformly and completely distributed over the substrate surface. This may be difficult to achieve, especially if the article on which the polymer is deposited is of a complex or intricate shape. The present invention provides a polymer which is an effective basecoat.

SUMMARY OF THE INVENTION

The present invention is directed to an article such as a plastic, ceramic or metallic article having a decorative and protective multi-layer coating deposited on at least a portion of its surface. More particularly, it is directed to an article or substrate, particularly a metallic article such as stainless steel, aluminum, brass or zinc, having deposited on its surface multiple superposed layers of certain specific types of materials. The coating is decorative and also provides corrosion resistance, wear resistance and abrasion resistance. The coating provides the appearance of chrome, highly polished brass or of nickel, i.e. has a chrome, brass or nickel color tone. Thus, an article surface having the coating thereon simulates a brass or nickel surface.

The article first has deposited on its surface an epoxy urethane based polymeric basecoat layer. On top of the polymeric layer is then deposited, by vapor deposition such as physical vapor deposition, one or more vapor deposited layers. More particularly disposed over the epoxy urethane based polymeric basecoat layer is a protective decorative color layer comprised of a chromium, chromium compound, refractory metal compound or a refractory metal alloy compound.

DESCRIPTION OF THE PREFERRED EMBODIMENT

The article or substrate 12 can be generally comprised of any material such as, for example, plastic, e.g., ABS, polyolefin, polyvinylchloride, and phenolformaldehyde, ceramic, metal or metal alloy. In one embodiment it is comprised of a metal or metallic alloy such as copper, steel, brass zinc, aluminum, nickel alloys and the like.

Figure 1:
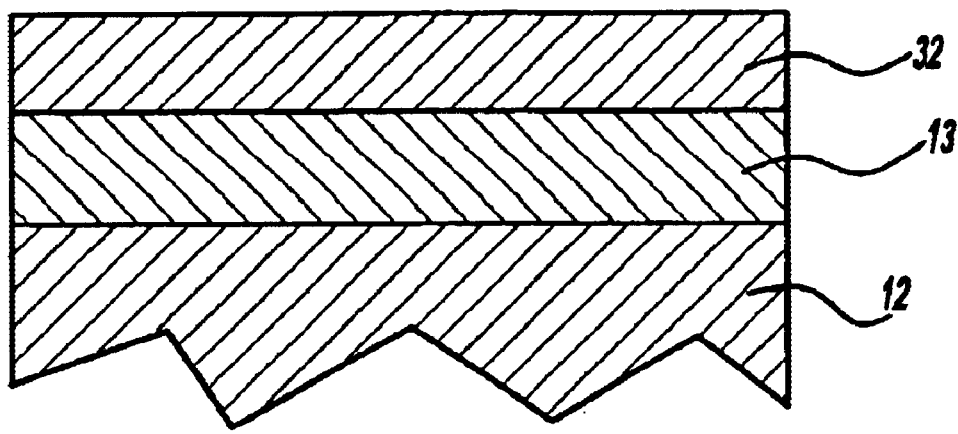
FIG. 1 is a cross sectional view of a portion of the substrate having a multi-layer coating comprising a polymeric base coat and a chromium, refractory metal compound color and protective layer directly on the top polymeric layer.
Figure 2:
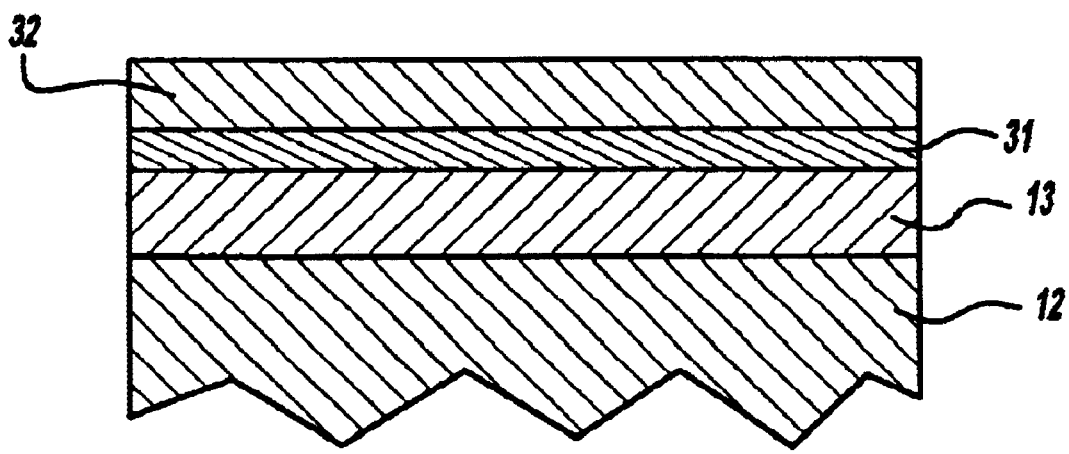
FIG. 2 is a view similar to FIG. 1 except that a chromium or refractory metal strike layer is present intermediate the polymeric layer and the chromium, chromium compound or refractory metal compound layer.
Figure 3:
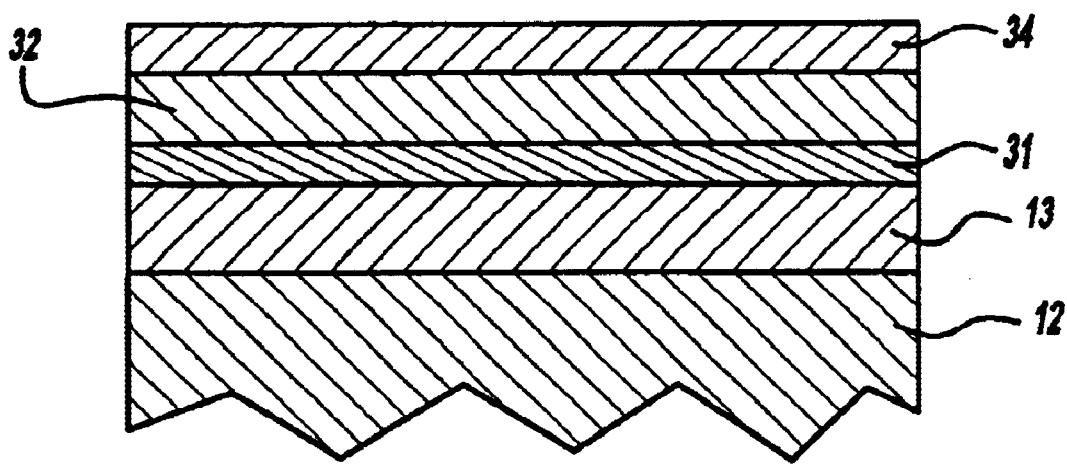
FIG. 3 is a view similar to FIG. 2 except that a refractory metal oxide layer is present on the refractory metal compound color layer.

In the instant invention, as illustrated in FIGS. 1–3, a first epoxy urethane based polymeric or resinous layer is applied onto the surface of the article. A second layer(s) is applied onto the surface of the polymeric layer by vapor deposition. The polymeric layer serves, inter alia, as a basecoat which levels the surface of the article. The polymeric or basecoat layer 13 is comprised of epoxy urethane based polymeric or resinous material.

The epoxy urethane based polymers and their preparation are well known and commercially available materials and are disclosed, inter alia, in U.S. Pat. Nos. 3,963,663; 4,705,841; 4,035,274; 4,052,280; 4,066,523; 4,159,233; 4,163,809; 4,229,335; 3,947,339; 3,963,663; 3,891,527 and 3,970,535, all of which are incorporated by reference. Particularly useful epoxy urethane based polymers or resins are those that are electrocoated onto the article. Such electrodepositable epoxy urethane based resins are described in the aforementioned U.S. Pat. Nos. 3,963,663; 4,066,523; 4,159,233; 4,035,274; 3,947,339; 3,963,663 and 4,070,258.

An example of an epoxy urethane resin which can be applied on an article comprises a polyepoxide, such as a diepoxide, reacted with diisocyanate, preferably in a molar ratio of about 2 mols of the polyepoxide per mol of diisocyanate to provide an epoxy urethane. This epoxy urethane is then coated on the article by any of the conventional and well known means such as, for example, by brushing, spraying, dipping and the like. If the epoxy urethane is to be electrocoated or electrodeposited on the article, which is the cathode, a hydroxy functional polyepoxide, such as a diepoxide, is adducted with diisocyanate, preferably in a molar ratio of about 2 mols of the polyepoxide per mol of the diisocyanate, to provide an epoxy urethane containing unreacted epoxy groups. This epoxy urethane is then adducted with an amine, preferably a polyamine, and more preferably a diprimary amine, in an amount effective to provide 1 mol of the amine per epoxy equivalent. In this way the epoxy functionality is eliminated, hydroxy functionality is generated, and the product contains amine functionality. This hydroxy functional polyamine may be precondensed with phenolic resin and employed in cathodic electrocoating.

Preferred polyepoxides are polyepoxides having a linear aromatic backbone and a molecular weight in the range of from about 600 to about 6,000. These include a hydroxy value enabling direct reaction with diisocyanate and providing sufficient resinification to provide good film forming properties. Examples of these polyepoxides include the diglycidyl ethers of bisphenols such as bisphenol A and having a 1,2-epoxy equivalency of about 1.4 to about 2.

The organic diisocyanates are illustrated by the conventional toluene diisocyanates. The organic diisocyanates are well known and include the aromatic diisocyanates and aliphatic diisocyanates.

After the reaction of the polyepoxide with the diisocyanate the adduct is reacted with a polyamine such as a diprimary amine.

Any organic diprimary amine may be used. Preferred diprimary amines are the aliphatic diamines derived from glycols.

The reaction of the amine with the epoxy urethane intermediate is carried out by heating the two reactants. About 1 mol of diamine per equivalent of epoxy functionality is used in order to react substantially all of the epoxy groups in the epoxy urethane while avoiding any significant proportion of unreacted diamine.

The result of the foregoing is a hydroxy functional resin containing a high amine functionality which is substantially free of epoxy functionality.

In the conventional cathodic electrodeposition using the aminoplast resins normally employed, the aminoplast resins, since they contain numerous nitrogen atoms, are electrophoretically propelled toward the cathode in the acidic electrocoating bath by the unidirectional electrical current which is employed. With the heat-hardening water soluble or dispersible phenolic resins used herein, these do not include nitrogen atoms and they do not, per se, have any strong tendency to migrate toward the cathode.

In one embodiment from about 2 to about 60 percent, based on the total weight of resin in the system is comprised of a water soluble or dispersible heat-hardening phenol-formaldehyde resin, commonly termed a phenolic resin. These phenolic resins are illustrated by the well known nongelled alkaline condensates of phenol with excess formaldehyde known as A-stage resols. The conventional reaction is carried out in the presence of a basic catalyst under moderate conditions of elevated temperature and for a limited period of time so as to avoid gelation of the resin.

In order to accentuate the desired electrophoretic movement, the water dispersible heat-hardening phenolic resin is heat reacted with the polyamine resin to cause a precondensation to take place, and the two resins to become fully compatibilized with one another.

This precondensate of the heat-hardening phenolic resin with the polyamine resin not only provides an efficient basis for coelectrodeposition, but it also enhances the speed of ultimate cure.

These polymeric materials may optionally contain the conventional and well known fillers such as mica, talc and glass fibers.

The epoxy urethane based copolymeric layer or basecoat layer 13 may be applied onto the surface of the substrate by any of the well known and conventional methods such as dipping, spraying, brushing and electrodeposition, with electrodeposition being preferred.

The polymeric layer 13 functions, inter alia, to level the surface of the substrate, cover any scratches or imperfections in the surface of the article and provide a smooth and even surface for the deposition of the succeeding vapor deposited layers.

The polymeric basecoat layer 13 has a thickness at least effective to level out the surface of the article or substrate. Generally, this thickness is at least about 1 um (micron), preferably at least about 2.5 um, and more preferably at least about 5 um. The upper thickness range should not exceed about 250 um, preferably about 100 um.

The epoxy urethane based polymers can be cured in the usual and known manner such as, for example, by thermal or light energy.

In some instances, depending on the substrate material, the polymeric basecoat does not adhere sufficiently well to the substrate. In such a situation a primer layer is deposited on the substrate to improve the adhesion of the polymeric basecoat to the substrate. The primer layer can be comprised, inter alia, of halogenated polyolefins. The halogenated polyolefins are conventional and well known polymers that are generally commercially available. The preferred halogenated polyolefins are the chlorinated and brominated polyolefins, with the chlorinated polyolefins being more preferred. The halogenated, particularly chlorinated, polyolefins along with methods for their preparation are disclosed, inter alia, in U.S. Pat. Nos. 5,319,032; 5,840,783; 5,385,979; 5,198,485; 5,863,646; 5,489,650 and 4,273,894, all of which are incorporated herein by reference.

The thickness of the primer layer is a thickness effective to improve the adhesion of the epoxy urethane polymeric basecoat layer to the substrate. Generally this thickness is at least about 0.1 um (micron). The upper thickness is not critical and generally is controlled by secondary considerations such as cost and appearance. Generally an upper thickness of about 25 um should not be exceeded.

Over the polymeric basecoat layer is then deposited, by vapor deposition such as physical vapor deposition and chemical vapor deposition, at least a protective and color layer 32 comprised of chromium, chromium compound, a refractory metal compound or a refractory metal alloy compound. The refractory metal compound includes a hafnium compound, a tantalum compound, a titanium compound or a zirconium compound, preferably a titanium compound or a zirconium compound. The refractory metal alloy compound includes the alloys of refractory metals such as a zirconium-titanium alloy compound. The compounds include the nitrides, oxides, carbides and carbonitrides. Thus, the chromium compound includes chromium nitride, chromium oxide, chromium carbide; the zirconium compound includes the zirconium nitrides, zirconium carbides, zirconium oxides and zirconium carbonitrides; the titanium compound includes the titanium nitrides, titanium carbides, titanium oxides and titanium carbonitrides. The preferred chromium compounds, refractory metal compounds and refractory metal alloy compounds are the chromium nitrides, refractory metal nitrides and refractory metal alloy nitrides.

The color of the coating will generally be determined by the composition of the vapor deposited color layer 32. Thus, for example, if layer 32 is comprised of chromium it will have a chrome color; if layer 32 is comprised of titanium nitride it will have a gold color. If layer 32 is comprised of zirconium nitride containing about a stoichiometric amount of nitrogen it will have a brass color. If layer 32 is comprised of a refractory metal nitride such as zirconium nitride or a refractory metal alloy nitride such as zirconium-titanium alloy nitride wherein the nitride or nitrogen content is less than stoichiometric and generally from about 6 to about 45 atomic percent, preferably from about 8 to about 35 atomic percent, it will have a nickel color.

The thickness of this color and protective layer 32 is a thickness which is at least effective to provide the color, e.g., chrome, brass or nickel and to provide abrasion resistance, scratch resistance, and wear resistance. Generally, this thickness is at least about 25 Å, preferably at least about 250 Å, and more preferably at least about 500 Å. The upper thickness range is generally not critical and is dependent upon secondary considerations such as cost. Generally a thickness of about 0.75 um, preferably about 0.5 um should not be exceeded.

One method of depositing layer 32 is by physical vapor deposition utilizing reactive sputtering or reactive cathodic arc evaporation. Reactive cathodic arc evaporation and reactive sputtering are generally similar to ordinary sputtering and cathodic arc evaporation except that a reactive gas is introduced into the chamber which reacts with the dislodged target material. Thus, in the case where zirconium nitride is the layer 32, the cathode is comprised of zirconium and nitrogen is the reactive gas introduced into the chamber.

In the embodiment illustrated in FIG. 1 the color and protective layer 32 is disposed directly on the polymeric basecoat layer 13. However, in other embodiments in addition to the protective color layer 32 there may optionally be present additional vapor deposited layers. These additional vapor deposited layers may include a layer comprised of chromium metal, refractory metal or refractory metal alloy. The refractory metals include hafnium, tantalum, zirconium and titanium. The refractory metal alloys include zirconium-titanium alloy, zirconium-hafnium alloy and titanium-hafnium alloy. The chromium metal layer, refractory metal layer or refractory metal alloy layer 31, if disposed intermediate the polymeric basecoat layer 13 and the color layer 32 as illustrated in FIG. 2, generally functions, inter alia, as a strike layer which improves the adhesion of the color layer 32 to the polymeric basecoat layer. As illustrated in FIGS. 2 and 3, the chromium metal, refractory metal or refractory metal alloy strike layer 31 is generally disposed intermediate the color layer 32 and the polymeric layer 13. Layer 31 has a thickness which is generally at least effective for layer 31 to function as a strike layer. Generally, this thickness is at least about 60 Å, preferably at least about 120 Å, and more preferably at least about 250 Å. The upper thickness range is not critical and is generally dependent upon considerations such as cost. Generally, however, layer 31 should not be thicker than about 1.2 um, preferably about 0.40 um, and more preferably about 0.25 um.

The chromium metal, refractory metal or refractory metal alloy layer 31 is deposited by conventional and well known vapor deposition techniques including physical vapor deposition techniques such as cathodic arc evaporation (CAE) or sputtering. Sputtering techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954 and 4,591, 418, all of which are incorporated herein by reference.

Briefly, in the sputtering deposition process a chromium metal or refractory metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge chromium, titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

In a preferred embodiment of the present invention the refractory metal is comprised of titanium or zirconium, preferably zirconium, and the refractory metal alloy is comprised of zirconium-titanium alloy.

The additional vapor deposited layers may also include chromium compounds, refractory metal compounds and refractory metal alloy compounds other than the above described nitrides. These chromium compounds, refractory metal compounds and refractory metal alloy compounds include the chromium oxides, refractory metal oxides and refractory metal alloy oxides; chromium carbides, refractory metal carbides and refractory metal alloy carbides; reaction products of (a) chromium metal, refractory metal or refractory metal alloy, (b) oxygen, and (c) nitrogen; and the chromium carbonitrides, refractory metal carbonitrides and refractory metal alloy carbonitrides.

In one embodiment of the invention as illustrated in FIG. 3 a layer 34 comprised of the reaction products of (i) chromium metal, a refractory metal or metal alloy, (ii) an oxygen containing gas such as oxygen, and (iii) nitrogen is deposited onto layer 32. The metals that may be employed in the practice of this invention are those which are capable of forming both a metal oxide and a metal nitride under suitable conditions, for example, using a reactive gas comprised of oxygen and nitrogen. The metals may be, for example, tantalum, hafnium, zirconium, zirconium-titanium alloy, and titanium, preferably titanium, zirconium-titanium alloy and zirconium, and more preferably zirconium.

The reaction products of the metal or metal alloy, oxygen and nitrogen are generally comprised of the metal or metal alloy oxide, metal or metal alloy nitride and metal or metal alloy oxy-nitride.

Thus, for example, the reaction products of zirconium, oxygen and nitrogen comprise zirconium oxide, zirconium nitride and zirconium oxy-nitride. These metal oxides and metal nitrides including zirconium oxide and zirconium nitride alloys and their preparation and deposition are conventional and well known, and are disclosed, inter alia, in U.S. Pat. No. 5,367,285, the disclosure of which is incorporated herein by reference.

The layer 34 can be deposited by well known and conventional vapor deposition techniques, including reactive sputtering and cathodic arc evaporation.

In another embodiment instead of layer 34 being comprised of the reaction products of chromium, a refractory metal or refractory metal alloy, oxygen and nitrogen, it is comprised of chromium oxide, refractory metal oxide or refractory metal alloy oxide. The refractory metal oxides and refractory metal alloy oxides of which layer 34 is comprised include, but are not limited to, hafnium oxide, tantalum oxide, zirconium oxide, titanium oxide, and zirconium-titanium alloy oxide, preferably titanium oxide, zirconium oxide, and zirconium-titanium alloy oxide, and more preferably zirconium oxide. These oxides and their preparation are conventional and well known.

Layer 34 is effective in providing improved chemical, such as acid or base, resistance to the coating. Layer 34 containing (i) the reaction products of chromium metal, refractory metal or refractory metal alloy, oxygen and nitrogen, or (ii) chromium oxide, refractory metal oxide or refractory metal alloy oxide generally has a thickness at least effective to provide improved chemical resistance. Generally this thickness is at least about 10 Å, preferably at least about 25 Å, and more preferably at least about 40 Å. Layer 34 should be thin enough so that it does not obscure the color of underlying color layer 32. That is to say layer 34 should be thin enough so that it is non-opaque or substantially transparent. Generally layer 34 should not be thicker than about 500 Å, preferably about 150 Å, and more preferably about 70 Å.

In order that the invention may be more readily understood, the following example is provided. The example is illustrative and does not limit the invention thereto.

EXAMPLE

Brass faucets are placed in a conventional soak cleaner bath containing the standard and well known soaps, detergents, deflocculants and the like which is maintained at a pH of 8.9–9.2 and a temperature of 180–200° F. for about 10 minutes. The brass faucets are then placed in a conventional ultrasonic alkaline cleaner bath. The ultrasonic cleaner bath has a pH of 8.9–9.2, is maintained at a temperature of about 160–180° F., and contains the conventional and well known soaps, detergents, deflocculants and the like. After the ultrasonic cleaning the faucets are rinsed and dried.

The faucets are immersed into a cathodic electrodeposition bath containing reaction products of a polyamine and epoxy-urethane available from Lilly Industries under the trade name Micro Finish. The resin is supplied by Lilly Industries at approximately 25–40% solids and is diluted with de-ionized water to a solids range between about 3% and 20%. The polymer basecoat is deposited on the cathodic substrate (faucets) by applying between about 50 and 400 D.C. volts for about three minutes with the electrodeposition bath temperature between about 75° F. and 120° F. The polymer coated faucets are removed from the electrodeposition bath and rinsed with water. The polymer coated faucets are placed in an oven and the polymer is cured at about 300° F. for 18 minutes followed by another cure for 18 minutes at about 500° F. to about 560° F. The resulting cured polymeric basecoat has a thickness of about 0.5 mil.

The polymeric coated faucets are placed in a cathodic arc evaporation plating vessel. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, a source of nitrogen gas is connected to the chamber by an adjustable valve for varying the rate of flow of nitrogen into the chamber.

A cylindrical cathode is mounted in the center of the chamber and connected to negative outputs of a variable D.C. power supply. The positive side of the power supply is connected to the chamber wall. The cathode material comprises zirconium.

The polymer coated faucets are mounted on spindles, 16 of which are mounted on a ring around the outside of the cathode. The entire ring rotates around the cathode while each spindle also rotates around its own axis, resulting in a so-called planetary motion which provides uniform exposure to the cathode for the multiple faucets mounted around each spindle. The ring typically rotates at several rpm, while each spindle makes several revolutions per ring revolution. The spindles are electrically isolated from the chamber and provided with rotatable contacts so that a bias voltage may be applied to the substrates during coating.

The vacuum chamber is evacuated to a pressure of about $10^{-5}$ to $10^{-7}$ torr and heated to about 100° C.

The polymer coated faucets are then subjected to a high-bias arc plasma cleaning in which a (negative) bias voltage of about 500 volts is applied to the polymer coated faucets while an arc of approximately 500 amperes is struck and sustained on the cathode. The duration of the cleaning is approximately five minutes.

Argon gas is introduced at a rate sufficient to maintain a pressure of about 1 to 5 millitorr. A layer of zirconium having an average thickness of about 0.1 um is deposited on the polymer coated faucets during a three minute period. The cathodic arc deposition process comprises applying D.C. power to the cathode to achieve a current flow of about 500 amps, introducing argon gas into the vessel to maintain the pressure in the vessel at about 1 to 5 millitorr and rotating the faucets in a planetary fashion described above.

After the zirconium layer is deposited a zirconium nitride protective and color layer is deposited on the zirconium layer. A flow of nitrogen is introduced into the vacuum chamber while the arc discharge continues at approximately 500 amperes. The flow of nitrogen is about 500 sccm and is continued for about 20 to 35 minutes to form a zirconium nitride color and protective layer having a thickness of about 1,500 to 7,500 Å. After this zirconium nitride layer is deposited the nitrogen flow is terminated and a flow of oxygen of approximately 30 to 70 standard liters per minute is introduced for a time of about 10 to 60 seconds. A thin layer of zirconium oxide with a thickness of about 10 to 100 Å is formed. The arc is extinguished, the vacuum chamber is vented and the coated articles removed.

While certain embodiments of the invention have been described for purposes of illustration, it is to be understood that there may be various embodiments and modifications within the general scope of the invention.

We claim:

1. An article having on at least a portion of its surface a multi-layer coating comprising:

basecoat layer comprised of reaction products of epoxy urethane resin and polyamine;

color and protective layer comprised of chromium, chromium nitride, refractory metal nitride or refractory metal alloy nitride.

2. The article of claim 1 wherein a layer comprised of chromium, refractory metal or refractory metal alloy is on said basecoat layer.

3. The article of claim 1 wherein a layer comprised of chromium oxide, refractory metal oxide or refractory metal alloy oxide is on said color and protective layer.

4. An article having on at least a portion of its surface a multi-layer coating comprising:
- basecoat layer comprised of reaction products of epoxy urethane resin and polyamine;
- layer comprised of chromium, refractory metal or refractory metal alloy;
- color and protective layer comprised of chromium, chromium compound, refractory metal compound or refractory metal alloy compound; and
- layer comprised of the reaction products of (i) chromium, refractory metal, (ii) oxygen and (iii) nitrogen on said color and protective layer.

5. The article of claim 4 wherein said chromium compound, refractory metal compound or refractory metal alloy compound is selected from the group consisting of nitrides, carbides, oxides and carbonitrides.

6. The article of claim 5 wherein said chromium compound, refractory metal compound or refractory metal alloy compound is chromium nitride, refractory metal nitride or refractory metal alloy nitride.

7. The article of claim 1 wherein on said color and protective layer is a layer comprised of the reaction products of (i) chromium, refractory metal or refractory metal alloy, (ii) oxygen and (iii) nitrogen.

8. An article having on at least a portion of its surface a multi-layer layer coating consisting essentially of:
- basecoat layer comprised of epoxy urethane rosin; and
- color and protective layer comprises of chromium, chromium nitride, refractory metal nitride or refractory metal alloy nitride.

* * * * *